United States Patent
Ehrne et al.

(10) Patent No.: US 12,106,987 B2
(45) Date of Patent: Oct. 1, 2024

(54) SAFEGUARDING DEVICE, WAFER TRANSPORT CONTAINER WITH AT LEAST ONE SAFEGUARDING DEVICE, SAFEGUARDING SYSTEM AND METHOD WITH THE SAFEGUARDING DEVICE

(71) Applicant: VAT Holding AG, Haag (CH)

(72) Inventors: Florian Ehrne, Frümsen (CH); Martin Netzer, Bludenz (AT); Andreas Hofer, Widnau (CH)

(73) Assignee: VAT Holding AG, Haag (CH)

( * ) Notice: Subject to any disclaimer, the term of this patent is extended or adjusted under 35 U.S.C. 154(b) by 1045 days.

(21) Appl. No.: 16/982,234

(22) PCT Filed: Mar. 22, 2018

(86) PCT No.: PCT/EP2018/057347
§ 371 (c)(1),
(2) Date: Sep. 18, 2020

(87) PCT Pub. No.: WO2019/179628
PCT Pub. Date: Sep. 26, 2019

(65) Prior Publication Data
US 2021/0035836 A1     Feb. 4, 2021

(51) Int. Cl.
*B65G 47/91* (2006.01)
*H01L 21/673* (2006.01)
*H01L 21/677* (2006.01)

(52) U.S. Cl.
CPC ........ *H01L 21/67373* (2013.01); *B65G 47/91* (2013.01); *H01L 21/67389* (2013.01); *H01L 21/67772* (2013.01)

(58) Field of Classification Search
CPC ... B65G 47/91; H01L 21/67; H01L 21/67373; H01L 21/67389; H01L 21/67772
(Continued)

(56) References Cited

U.S. PATENT DOCUMENTS 6,338,604 B1   1/2002   Okabe et al.
6,390,145 B1   5/2002   Okabe et al.
(Continued)

FOREIGN PATENT DOCUMENTS

JP   2000-315725 A   11/2000
JP   2001-53137 A     2/2001
(Continued)

OTHER PUBLICATIONS

International Search Report of the International Searching Authority mailed Dec. 7, 2018 for the corresponding International application No. PCT/EP2018/057347.
(Continued)

*Primary Examiner* — Bryon P Gehman
(74) *Attorney, Agent, or Firm* — Posz Law Group, PLC (57) ABSTRACT

A safeguarding device includes one or more positive-fit units that safeguard a wafer-transport-container opening element of a wafer transport container, which is held in its closure position by a closing mechanism. The closing mechanism includes one or more chambers, which includes a pressure connection channel that allows a variation of an inner pressure in the chamber relative to a reference pressure. A differential pressure is calculated from the inner pressure of the chamber and the reference pressure and influences a safeguarding status of the positive-fit unit.

23 Claims, 4 Drawing Sheets

(58) Field of Classification Search
USPC .............. 206/710; 220/231, 232, 324, 378; 414/217, 217.1
See application file for complete search history.

(56) References Cited

U.S. PATENT DOCUMENTS

| | | | | |
|---|---|---|---|---|
| 6,398,475 | B1* | 6/2002 | Ishikawa | H01L 21/67373 |
| | | | | 414/217 |
| 9,406,537 | B2* | 8/2016 | Oyama | H01L 21/67772 |
| 2009/0245981 | A1* | 10/2009 | Miyajima | H01L 21/67373 |
| | | | | 220/377 |
| 2015/0285382 | A1 | 10/2015 | Kienreich et al. | |

FOREIGN PATENT DOCUMENTS

| | | |
|---|---|---|
| JP | 2004-356478 A | 12/2004 |
| JP | 2015-197221 A | 11/2015 |
| KR | 2001-0050010 A | 6/2001 |
| TW | 440909 B | 6/2001 |
| TW | 506036 B | 10/2002 |

OTHER PUBLICATIONS

International Preliminary Report on Patentability issued on Sep. 22, 2020 for the corresponding international application No. PCT/EP2018/057347.
Office Action of Apr. 26, 2022 issued in corresponding JP Patent Application No. 2020-541995 (and English translation).
Office Action of Apr. 26, 2022 issued in corresponding KR Patent Application No. 10-2020-7026894 (and English translation).
Office Action mailed Sep. 25, 2023 in corresponding Chinese Patent Application No. 201880090997.0 (and English Summary).
Office Action dated Aug. 9, 2022 issued in corresponding Taiwanese Patent Application No. 108109862 (and English translation).
Office Action mailed Apr. 29, 2024 in corresponding Chinese Patent Application No. 201880090997.0 (and English Summary).

* cited by examiner

SAFEGUARDING DEVICE, WAFER TRANSPORT CONTAINER WITH AT LEAST ONE SAFEGUARDING DEVICE, SAFEGUARDING SYSTEM AND METHOD WITH THE SAFEGUARDING DEVICE

CROSS REFERENCE TO RELATED APPLICATIONS

This application is a U.S. national stage application of PCT/EP2018/057347 filed on Mar. 22, 2018, the contents of which are incorporated herein by reference.

STATE OF THE ART

The invention concerns a safeguarding device according to the preamble of claim 1, a wafer transport container with at least one safeguarding device according to claim 18, a safeguarding system according to claim 21 and a method with the safeguarding device according to claim 23.

Safeguarding devices are known from the state of the art.

The objective of the invention is in particular to provide a generic device having advantageous safeguarding properties. The objective is achieved, according to the invention, by the features of claims 1, 18, 21 and 23 while advantageous implementations and further developments of the invention may be gathered from the subclaims.

Advantages of the Invention

A safeguarding device, in particular a safeguarding device for a wafer transport container, is proposed, with at least one positive-fit unit configured at least for a safeguarding of a wafer-transport-container opening element of a wafer transport container, which is held in its closure position by a closing mechanism.

By the implementation of the safeguarding device according to the invention, in particular advantageous safeguarding properties are achievable, in particular regarding a fail-safe behavior. This advantageously allows achieving a high level of fail-proof performance, functional safety and/or operational safety, in particular of the wafer transport container. Advantageously it is possible to avoid inadvertent opening of the wafer transport container, and thus in particular damaging of contents of the wafer transport container, e.g. by dropping out, in particular in case of a malfunction of the closing mechanism of the wafer transport container. This also advantageously allows avoiding damages to the wafer transport container, in particular of the wafer-transport-container opening element and/or of an external element, which could be hit by falling parts. Moreover an extent to which contents of the wafer transport container are exposed to an atmosphere surrounding the wafer transport container is advantageously reducible, as a result of which in particular particles contained in the ambient atmosphere may be prevented at least partially from entering an interior of the wafer transport container. Advantageously costs occurring due to damaging of the contents of the wafer transport container, damaging of the wafer transport container itself and/or damaging of external elements may be avoided. In particular within a highly automated wafer production environment, parts lying around loosely and/or dropping out without control will bring about production downtime and thus huge costs by damaging and/or blockage of machines and/or conveying paths, such costs being advantageously avoidable by suitable safeguarding implemented by means of the safeguarding device.

By a "safeguarding device" is in particular a device to be understood which is configured to safeguard at least one closing mechanism, wherein the closing mechanism and the safeguarding device are preferably implemented separately from one another. In particular, the safeguarding device is configured for a safeguarding of a wafer transport container that has already been closed by the closing mechanism against unexpected and/or inadvertent opening, in particular in case of a malfunction of the closing mechanism. In particular, a safety element of the safeguarding device engages only in case of failure, in particular total failure, of the closing mechanism. In particular, the closing mechanism and the safeguarding device, in particular the positive-fit unit, use different functionalities and/or different physical forces, e.g. pressure forces and/or friction forces, for the purpose of safeguarding the wafer-transport-container opening element in the closure position. In particular, the safeguarding device, in particular the positive-fit unit of the safeguarding device, implements a closing mechanism that is redundant with respect to the closing mechanism. In particular, the safeguarding device, in particular the positive-fit unit of the safeguarding device, implements at least partly a diverse redundancy with respect to the closing mechanism. In particular the safeguarding device, in particular the positive-fit unit of the safeguarding device, is configured to safeguard the closing mechanism by way of a passive redundancy and/or stand-by redundancy. Alternatively the safeguarding device, in particular the positive-fit unit of the safeguarding device, may also implement at least partly a homogeneous redundancy with respect to the closing mechanism. "Configured" is in particular to mean specifically programmed, designed and/or equipped. By an object being configured for a certain function is in particular to be understood that the object fulfills and/or implements said certain function in at least one application state and/or operation state.

A "wafer transport container" is in particular to mean a transport container with a closable inner space, wherein the inner space is configured to accommodate at least one wafer. In particular the wafer transport container is configured at least for a transport of wafers having a diameter of at least 200 mm, preferably at least 300 mm and preferentially at least 450 mm. In particular the wafer transport container is at least configured for a transport of at least one wafer, preferably at least three wafers, advantageously at least five wafers, especially advantageously at least ten wafers, preferably at least 25 wafers and particularly preferably no more than 100 wafers. In particular the wafer transport container is embodied to be portable. In particular the wafer transport container is embodied to be vacuum-tightly sealable. Preferentially the wafer transport container is a vacuum wafer transport container, which is in particular configured to create and/or maintain a vacuum atmosphere in its interior. In particular the wafer transport container is configured to store wafers in the vacuum atmosphere. By a "vacuum atmosphere" is in particular an atmosphere to be understood the pressure of which is below 300 hPa, preferably below 1 hPa, preferentially below $10^{-3}$ hPa and especially preferably below $10^{-6}$ hPa. In particular the wafer transport container has, under the vacuum atmosphere, a high level of tightness, wherein in particular a leakage rate of the wafer transport container is less than $10^{-4}$ mbar*l/s, preferably less than $10^{-5}$ mbar*l/s, advantageously less than $10^{-6}$ mbar*l/s, especially advantageously less than $10^{-7}$ mbar*l/s, preferentially less than $10^{-8}$ mbar*l/s and particularly preferably less than $10^{-9}$ mbar*l/s. Alternatively the wafer transport container may be configured to store and/or hold wafers in a standard atmosphere and/or in a specifically composed atmosphere, e.g. a nitrogen atmosphere. The closing mechanism is in particular implemented as a vacuum closing mechanism. In particular, in a properly closed state, the wafer-transport-container opening element is held in the closure position by atmospheric pressure forces. In the properly closed state a pressure is smaller in the interior of the wafer transport container than outside the wafer transport container, as a result of which in particular the closing forces closing the wafer transport container depend on a differential pressure between the interior of the wafer transport container and the outside atmosphere. Alternatively the closing mechanism may also be embodied as a mechanical closing mechanism and/or magnetic closing mechanism. A "closure position" is in particular to mean a positioning zone, in particular a position, of the wafer-transport-container opening element, in which the wafer-transport-container opening element closes an interior of the wafer transport container at least substantially, preferably completely, in particular by a positioning of the wafer-transport-container opening element in a proximity of an opening of a base body of the wafer transport container and/or by an immediate abutment of the wafer-transport-container opening element on the opening of the base body. The wafer-transport-container opening element is in particular embodied as a cover, which is in particular implemented in such a way that it is completely separable and/or removable from the base body of the wafer transport container. Alternatively the wafer-transport-container opening element may be embodied as a flap and/or as a slide element. Preferentially the wafer-transport-container opening element forms a bottom plate of the wafer transport container. It is conceivable that a wafer transport container comprises more than one wafer-transport-container opening element, wherein preferably all the closing mechanisms of the of the wafer-transport-container opening elements are safeguarded by means of the safeguarding device.

By a "positive-fit unit" is in particular a unit to be understood which is configured to implement a positive-fit connection for a safeguarding via the safeguarding device. A "positive-fit connection" is in particular to mean an at least partial geometrical engagement of two structural components, in particular of two structural components of the positive-fit unit, preferentially for a force transmission. The positive-fit unit is in particular embodied as a locking bar unit, preferably comprising at least one locking bar element and at least one locking bar recess, wherein the locking bar element may engage into the locking bar recess in particular for the purpose of implementing and/or preparing a positive-fit connection. By "preparing a positive-fit connection" is in particular to be understood that the locking bar element is situated within a hollow that is implemented by the locking bar recess, without contacting a wall of the locking bar recess. By "implementing a positive-fit connection" is in particular to be understood that the locking bar element is situated within the hollow implemented by the locking bar recess in such a way that it is in a touch contact with the wall of the locking bar recess. In particular the positive-fit unit implements an emergency locking of the wafer-transport-container opening element, which is in particular configured to hold the wafer-transport-container opening element in the closure position in case of a failure of the closing mechanism.

It is further proposed that the positive-fit unit comprises at least one positive-fit recess and at least one positive-fit element, wherein the positive-fit recess and the positive-fit element are configured to couple with one another in a contact-free fashion in case of a proper safeguarding, in particular in a safeguarded state of the safeguarding device and in a non-safeguard state of the safeguarding device. This in particular allows achieving advantageous safeguarding characteristics, which may in particular result in a high level of fail-proof performance, functional safety and/or operational safety of the wafer transport container, while at the same time advantageously avoiding particles being generated, e.g. due to friction. In particular in a cleanroom environment and/or in a vacuum environment, minimizing a number of particles provides a great advantage as in this way damages to sensitive work pieces, e.g. wafers, and/or leakage of seals, e.g. vacuum seals, are avoidable. Advantageously contacting of the positive-fit recess with the positive-fit element and thus a potential generation of particles only occurs in a safeguarding case, in which the closing mechanism fails and the safeguarding device acts.

The positive-fit recess in particular implements the locking bar recess, a locking bar opening and/or a locking bar engagement. The positive-fit element in particular implements a projection, which is configured to engage in the positive-fit recess for safeguarding. In particular the positive-fit element implements the locking bar element. The positive-fit element is in particular embodied to be relative to the positive-fit recess, in particular for establishing and/or releasing the positive-fit connection. Alternatively the positive-fit recess may be embodied to be mobile with respect to the positive-fit element, in particular for establishing and/or releasing the positive-fit connection. A "proper safeguarding" is in particular to mean a stable and/or vacuum-tight securing of the wafer-transport-container opening element by the closing mechanism, in particular during a storage phase and/or transport phase. A "proper release of the safeguard state" is in particular to mean a controlled release, implemented according to a given pattern, of the wafer-transport-container opening element from the base body of the wafer transport container. The proper release of the safeguard state is preferentially carried out in a state when the wafer transport container is coupled with a loading and/or unloading station. By the positive-fit recess and the positive-fit element "coupling with one another in a contact-free fashion" is in particular to be understood that, when a safeguarding is established by the positive-fit unit and/or when the safeguarding is maintained by the positive-fit unit, the positive-fit recess and the positive-fit element are free of mutual contact points.

If the safeguarding device is embodied at least partially integrally with the wafer transport container, in particular with the base body of the wafer transport container, a high degree of safety is advantageously achievable, in particular as a loss of the safeguarding device and/or forgetting to install the safeguarding device are/is advantageously avoidable. "Embodied integrally" is in particular to mean at least connected by substance-to-substance bond, for example via a welding process, a gluing process, an injection-molding process and/or another process that is deemed expedient by someone skilled in the art, and/or advantageously formed in one piece, for example via manufacturing from one cast and/or via manufacturing in a one-component or multi-component injection molding process, and advantageously from a single blank.

It is moreover proposed that the safeguarding device comprises at least one reset element, which is configured to re-deflect the positive-fit unit, in particular the positive-fit element, at least partly into a safeguarding position and/or to hold the positive-fit unit, in particular the positive-fit element, in the safeguarding position. This advantageously allows achieving a high degree of safety of the safeguarding device, in particular as regards a fail-safe function. In particular, in this way a safeguarded state is advantageously implemented as a base state. Furthermore in this way advantageously a safeguarding position is autonomously established subsequently to a release of the safeguarding and/or subsequently to a termination of an active release. The reset element is preferably embodied as an elastically deformable element, e.g. as a spring, wherein in particular the spring may be embodied in particular as a flexible spring, as a compression spring, as a disk spring, as a torsional spring, as an air spring and/or as a gas compression spring. Alternatively or additionally the reset element may further comprise a reset element differing from a spring, e.g. mutually repelling magnets and/or an element made of an elastically deformable material, e.g. rubber. Beyond this the reset element, the positive-fit element and/or the positive-fit recess could alternatively be movable, controllable and/or regulatable via an actuating motor. The "safeguarding position" is in particular implemented as a position of the positive-fit unit, in particular of the positive-fit element, in which the closing mechanism is safeguarded and/or in which the positive-fit element engages into the positive-fit recess, in particular in a contact-free fashion.

Furthermore it is proposed that the safeguarding device comprises at least one chamber, which is in particular gas-tightly insulatable from an environment and which comprises a pressure connection channel that is configured to allow a variation of an inner pressure in the chamber relative to a reference pressure, wherein a differential pressure is calculated from the inner pressure of the chamber and the reference pressure and is configured to influence a safeguarding status of the positive-fit unit. In this way in particular advantageous safeguarding properties are achievable. Moreover in particular an especially advantageous method of setting the positive-fit unit may be created, which is in particular free of mechanical drive parts, thus advantageously reducing complexity. It is furthermore advantageously possible to use an already existing vacuum system for operating the positive-fit unit, thus advantageously allowing a reduction of complexity. A "chamber" is in particular embodied as an at least largely closed hollow space in a structural component, in particular in the safeguarding device. "Largely" is in particular to mean at least by 51%, preferentially at least by 88%, advantageously at least by 75%, preferably at least by 85% and especially preferentially at least by 95%. In particular the chamber, in particular with the exception of the pressure connection channel, is implemented to be vacuum-tight. In particular the chamber is configured to be vacuumized in at least one operating state of the safeguarding device. The pressure connection channel is configured at least as a connection of an interior of the chamber to an environment and/or atmosphere outside the chamber. The pressure connection channel is in particular embodied as a bore in a wall of the chamber, as a breakthrough in a wall of the chamber, as an opening of the chamber, as a duct, as a flexible tube and/or as another channel-forming connection between an interior and an exterior of the chamber. Preferably the pressure connection channel is oriented toward a connection element of a vacuum pump unit, in particular pointing vertically downward. In a coupling of the safeguarding device with a vacuum pump unit, in particular in a coupling of the wafer transport container with the loading and/or unloading station, the pressure connection channel is configured to be coupled vacuum-tightly with a suction element of the vacuum pump unit. The coupling of the pressure connection channel and the suction element is preferably effected simultaneously with and/or automatically upon a coupling of the wafer transport container and the loading and/or unloading station. In particular the suction element is embodied integrally with a vacuum-clamping device of the loading and/or unloading station, which is configured for tensioning the wafer transport container with the loading and/or unloading station by way of a negative pressure. The suction element is preferentially embodied as an opening of a channel of the vacuum-clamping device. In particular the pressure connection channel is free of coupling elements, in particular separate coupling elements, for coupling with the vacuum pump unit. In particular coupling of the pressure connection channel with the suction element is effected by a direct contact of an opening of the pressure connection channel and an opening of the suction element. Dispensing with separate coupling elements advantageously allows a reduction of complexity. A "variation of an inner pressure of the chamber" is in particular to mean a lowering and/or increasing of the inner pressure in the chamber at least by 80%. A "reference pressure" is in particular to mean an ambient pressure, preferably a standard atmospheric pressure, e.g. 1013.25 hPa, and preferably a cleanroom atmospheric pressure, e.g. 1013.35 hPa. A safeguarding status is in particular implemented as a safeguarded state of the safeguarding device and/or as a non-safeguard state of the safeguarding device, in particular of the positive-fit unit. By "a safeguarding status being influenced by a differential pressure" is in particular to be understood that the safeguard state of the safeguarding device and/or the non-safeguard state of the safeguarding device come/comes about depending on the differential pressure wherein, in particular in case of a large differential pressure, which preferentially exceeds 80% of the reference pressure, the non-safeguard state comes about in particular automatically and/or, in case of a low differential pressure, which is in particular below 80% of the reference pressure, the safeguard state comes about, in particular automatically.

If the at least one reset element is arranged, at least to a large extent, inside the chamber, this advantageously allows a compact construction. By "at least to a large extent inside" is in particular to be understood inside at least by 51%, preferably at least by 66%, advantageously at least by 75%, especially advantageously at least by 85%, preferably at least by 95% and particularly preferably by 100%.

It is moreover proposed that the positive-fit unit comprises at least one movably supported positive-fit element, wherein a position of the positive-fit element relative to at least one chamber wall of the chamber, in particular to a chamber wall which the reset element is supported on, depends on the differential pressure. In this way advantageously an actuation of the positive-fit unit, in particular for the purpose of safeguarding the closing mechanism, is achievable, said actuation being free of mechanical actuation elements. This advantageously allows keeping a particle generation at a low level. Alternatively the positive-fit recess may be supported in such a way that it is movable depending on the differential pressure. In particular, the position comprises at least two stable positions wherein, in a first stable position, the positive-fit element engages in the positive-fit recess at least partially and/or contact-free and, in a second stable position, the positive-fit element is free of an engagement with the positive-fit recess. A movement between the first stable position and the second stable position is implemented in particular continuously and/or free of stable intermediate positions.

If the positive-fit unit, in particular the positive-fit element, is configured to take a non-safeguard position if the differential pressure exceeds a limit differential pressure, it is advantageously achievable that a normal state of the positive-fit unit, in particular a normal state of the positive-fit unit that is brought about automatically, which is established if the pressure connection channel is open towards an environment, is realized as a safeguard state of the safeguarding device. This advantageously allows a high degree of safety, in particular while the safeguarding device, in particular the wafer transport container, is in a storage state and/or transport state. The "limit differential pressure" is in particular implemented as a differential pressure in which the pressure force acting onto the positive-fit element due to the pressure difference between the inner pressure in the chamber and the reference pressure has at least substantially the same value as a reset force, in particular a spring-elastic force, of the reset element. In particular, the limit differential pressure is at least greater than 80%, preferably at least greater than 90%, preferentially at least greater than 95% and particularly preferably at least greater than 99% of the ambient pressure, which is preferentially the standard atmospheric pressure of 1013.25 hPa and preferably the cleanroom atmospheric pressure of 1013.35 hPa.

In addition it is proposed that the safeguarding device comprises at least one further chamber having, in a safeguard state of the safeguarding device and in a non-safeguard state of the safeguarding device, an inner pressure that has the same value as the ambient pressure. This advantageously allows a generation of an internal pressure difference within the safeguarding device. Moreover the volume of the chamber that is to be vacuumized may be advantageously kept small, as a result of which a high adjustment velocity for a safeguarding of the positive-fit unit and/or for a release of the safeguarding of the positive-fit unit is advantageously achievable. In particular, the chamber and the further chamber have at least one shared chamber wall, which is preferably embodied to be vacuum-tight and/or movable. In particular, the inner volume/volumes of the chamber and/or of the further chamber are/is variable, in particular depending on a position of the movable chamber wall between the chamber and the further chamber. The further chamber is in particular permanently open towards the environment. The inner pressure in the further chamber in particular corresponds to the reference pressure.

Beyond this it is proposed that the safeguarding device comprises at least one movably supported setting element, which delimits the chamber and the further chamber at least partly. This advantageously allows creating a movement which depends on the respective inner pressures of the chamber and the further chamber, in particular independently from electrical and/or mechanical drive elements. The setting element in particular implements the shared chamber wall of the chamber and the further chamber. The setting element is in particular supported in such a way that it is gas-tightly movable. The setting element is in particular embodied as a gas-tightly sealed, translationally movable piston. The position of the setting element within the safeguarding device and thus the volumes of the chamber and the further chamber depend on the differential pressure between the chamber and the further chamber.

If the setting element is configured to vary, depending on a pressure difference of the inner pressures of the chamber and the further chamber, an inner volume of the chamber and/or an inner volume of the further chamber, an already existing vacuum system may advantageously be utilized for operating the positive-fit unit, as a result of which a complexity is advantageously reducible.

It is also proposed that the safeguarding device comprises at least one additional further chamber, which is configured to have in at least one operating state, in particular in a non-safeguard state of the safeguarding device, an inner pressure that differs from the ambient pressure, in particular from the reference pressure. This advantageously allows optimizing a pressure distribution within the safeguarding device.

If the safeguarding device comprises a linear bearing that is configured to permit a translational movement of the positive-fit unit, in particular of the positive-fit element and/or of the positive-fit recess, advantageously a high level of mobility of at least a portion of the positive-fit unit may be rendered possible. Beyond this, a particle generation may be kept low by means of a linear bearing. The linear bearing is in particular implemented as a slide bearing and/or as a ball bearing. It is also conceivable that the linear bearing is embodied at least partly integrally with the positive-fit unit, in particular at least with a guide element, in particular a support rod, guiding the positive-fit element.

If moreover the pressure connection channel is configured to couple, in particular gas-tightly, without a flexible tube and/or free of separate coupling elements, at least the chamber with a vacuum-clamping device of a loading and/or unloading station that is configured at least for loading and/or unloading at least one wafer into and/or from a wafer transport container, it is advantageously possible to use an already existing vacuum system for operating the positive-fit unit, thus advantageously facilitating a reduction in complexity.

Beyond this it is proposed that the safeguarding device comprises at least one emergency safeguarding and/or emergency release element, which in particular implements a cam mechanism and which is configured for a manual emergency safeguarding and/or emergency release of the safeguarding device, in particular of the positive-fit unit. In this way a manual operation of the safeguarding device is advantageously rendered possible, thus advantageously allowing an easy intervention by an operator, e.g. in case of an emergency.

If the emergency safeguarding and/or emergency release element is arranged at least partly in the further chamber, this advantageously permits a compact structure. In particular, the emergency safeguarding and/or emergency release element is not completely removable from the further chamber. In particular, in case of an emergency release, the emergency safeguarding and/or emergency release element is at least partly moved out of the further chamber. The emergency safeguarding and/or emergency release element is in particular visible from outside the safeguarding device. It is in particular easily perceivable from an outside if the emergency safeguarding and/or emergency release element has been actuated for the purpose of establishing the manually non-safeguard state. This advantageously allows avoiding an unintended continuous manual release. By the emergency safeguarding and/or emergency release element being "arranged at least partly in the further chamber" is in particular to be understood that, in a normal state, in which the emergency safeguarding and/or emergency release element has in particular not been pulled out for a manual release of the safeguarding device, in particular of the positive-fit unit, at least 50% of the volume, preferably at least 65% of the volume, preferentially at least 75% of the volume, preferably at least 75%, and especially preferentially no more than 90% of the volume of the emergency safeguarding and/or emergency release element are enclosed by chamber walls of the further chamber, and/or that, in a non-safeguard state of the safeguarding device, in particular of the positive-fit unit, induced by pulling out the emergency safeguarding and/or emergency release element, at least 35% of the volume, preferably at least 50% of the volume, preferentially at least 65% of the volume and particularly preferably no more than 80% of the volume of the emergency safeguarding and/or emergency release element are encompassed by the chamber walls of the further chamber.

It is also proposed that the safeguarding device comprises at least one status sensor, which is configured to sense a safeguarding status of the safeguarding device, in particular a position of a positive-fit element of the positive-fit unit of the safeguarding device. This advantageously allows an automated and/or electronic read-out of the safeguarding status, as a result of which in particular a remote monitoring can be facilitated. Moreover a high level of operational safety is advantageously achievable, in particular as, for example, an automated check of the safeguarding status of the safeguarding device, in particular of the positive-fit unit, may be rendered possible prior to a removal and/or opening of the wafer-transport-container opening element by the loading and/or unloading station. This advantageously allows a reduction of a danger due to damages caused by malfunctioning of the safeguarding device. The status sensor is in particular implemented as a magnetic sensor. Alternatively or additionally the status sensor may comprise at least one optical sensor, e.g. a camera and/or a light barrier, and/or a contact sensor.

Furthermore a wafer transport container is proposed, with at least one safeguarding device which is configured to prevent, in a safeguarding case, a complete removal of the wafer-transport-container opening element from a base body of the wafer transport container, in particular in case of a failure of the closing mechanism of the wafer transport container. By an implementation of the wafer transport container according to the invention, in particular advantageous safeguarding properties are achievable, in particular in regard to a fail-safe behavior. In this way a high level of fail-proof performance, functional safety and/or operational safety, in particular of the wafer transport container, is advantageously achievable. It is conceivable that the safeguarding device permits partial removal of the wafer-transport-container opening element and/or permits reducing a pressure force with which the wafer-transport-container opening element is pressed onto the base body of the wafer transport container. In particular, the safeguarding device of the wafer transport container may comprise a plurality of separately embodied safeguarding modules, each with at least one positive-fit unit safeguarding the closing mechanism of the wafer-transport-container opening element. In particular, the separately implemented safeguarding modules of the safeguarding device are arranged, preferably spaced apart in a regular manner, in a circumferential direction around the wafer-transport-container opening element and/or around the base body of the wafer transport container. The safeguarding case is given in particular if, in particular in an operating state in which the wafer transport container is free of a coupling with the loading and/or unloading station, the closing mechanism does not hold and/or cannot hold the wafer-transport-container opening element in the closure position.

In a case when the at least one safeguarding device is embodied integrally with the base body of the wafer transport container, a simple construction may advantageously be facilitated.

Beyond this it is proposed that the wafer transport container, in particular at least the wafer-transport-container opening element, comprises at least one positive-fit recess, the positive-fit recess implementing a further pressure connection channel that is configured for an evacuation of an additional further chamber of the safeguarding device. This advantageously allows facilitating a simple coupling of at least one chamber of the safeguarding device, in particular of the additional further chamber of the safeguarding device, with the vacuum pump system.

Furthermore a safeguarding system is proposed, in particular a vacuum safeguarding system, with at least one safeguarding device, with a wafer transport container and with a loading and/or unloading station which is configured at least for loading and/or unloading wafers into and/or from the wafer transport container. The implementation of the safeguarding system according to the invention in particular allows achieving advantageous safety characteristics, in particular in regard to a fail-safe behavior. In this way advantageously a high level of fail-proof performance, functional safety and/or operational safety, in particular of the wafer transport container, is achievable.

If the safeguarding system comprises a vacuum pump unit, which is configured at least for a vacuum-clamping of the wafer transport container on the loading and/or unloading station in a loading and/or unloading position and for varying an inner pressure in a chamber, a complexity may advantageously be kept low, in particular as advantageously only one vacuum system is required, and not two separate vacuum systems. It is moreover advantageously possible to mutually adjust respective suction rates easily for varying the inner pressure in the chamber and for vacuum-clamping to one another. This advantageously allows ensuring that the safety element of the safeguarding device, in particular the positive-fit unit, is only released if the wafer transport container is successfully and/or correctly fixated on the loading and/or unloading station by the vacuum-clamping device. In particular, a coupling of the vacuum pump unit with the pressure connection channel of the chamber is only established if the wafer transport container is successfully and/or correctly fixated on the loading and/or unloading station. In particular, the vacuum pump unit comprises one single pump, which is configured to fulfill both tasks, in particular the task of vacuum-clamping and the task of releasing the safeguarding device, in particular of the positive-fit unit. Alternatively the vacuum pump unit may comprise a plurality of pumps for different tasks.

Beyond this a method with a safeguarding device having at least one positive-fit unit is proposed, wherein a wafer-transport-container opening element of the wafer-transport-container, which is held in its closure position by a closing mechanism, is safeguarded by means of the positive-fit unit. The implementation of the method according to the invention in particular allows achieving advantageous safeguarding characteristics, in particular in regard to a fail-safe behavior. In this way a high level of fail-proof performance, functional safety and/or operational safety, in particular of the wafer transport container, is advantageously achievable.

It is further proposed that a safeguarding and/or release of a safeguarding of the positive-fit unit is realized by a variation of an inner pressure in a chamber of the safeguarding device. In this way a complexity can be advantageously kept at a low level, in particular as separate mechanical and/or electrical drive units may be dispensed with.

Moreover it is proposed that, in a fault-free normal operation of the closing mechanism, the wafer-transport-container opening element is safeguarded by the positive-fit unit in a contact-free fashion wherein, in case of a malfunction of the closing mechanism, a touch contact is established of the positive-fit unit, in particular a positive-fit element of the positive-fit unit, with the wafer-transport-container opening element for the purpose of establishing a holding of the wafer-transport-container opening element in a proximity of the closure position. This advantageously allows avoiding a particle generation in the fault-free normal operation, in particular as surface frictions are avoided in the fault-free normal operation and in a safeguarding and/or releasing of the positive-fit unit. In particular, in case of a malfunction of the closing mechanism, the wafer-transport-container opening element gets detached from the base body of the wafer transport container. As a result of this, the wafer-transport-container opening element is moved away from the opening of the wafer transport container, for example due to gravity. The movement of the wafer-transport-container opening element leads to a touch contact of the positive-fit element of the positive-fit unit with the positive-fit recess of the wafer-transport-container opening element, resulting in the wafer-transport-container opening element being held in a proximity of its original position. The proximity is in particular realized as a region comprising the wafer-transport-container opening element in its closure position, wherein deviations from the closure position may occur of maximally 10 mm, preferably maximally 5 mm, advantageously maximally 3 mm, preferably no more than 2 mm and particularly preferably at least 0.5 mm in at least one direction, preferentially in a direction that is perpendicular to a main extension plane of the wafer-transport-container opening element. By a "main extension plane" of a structural unit is in particular a plane to be understood which is parallel to a largest side area of a smallest imaginary rectangular cuboid just still enclosing the structural unit, and which in particular extends through the center point of the rectangular cuboid.

The safeguarding device according to the invention, the wafer transport container according to the invention, the safeguarding system according to the invention and the method according to the invention are herein not to be restricted to the application and implementation form described above. In particular, to fulfill a functionality herein described, the safeguarding device according to the invention, the wafer transport container according to the invention, the safeguarding system according to the invention and the method according to the invention may comprise a number of respective elements, structural components and units as well as method steps that differs from a number that is mentioned here.

DRAWINGS

Further advantages will become apparent from the following description of the drawings. In the drawings an exemplary embodiment of the invention is illustrated. The drawings, the description and the claims contain a plurality of features in combination. Someone skilled in the art will purposefully also consider the features separately and will find further expedient combinations.

It is shown in.

DESCRIPTION OF THE EXEMPLARY EMBODIMENT

Figure 1:
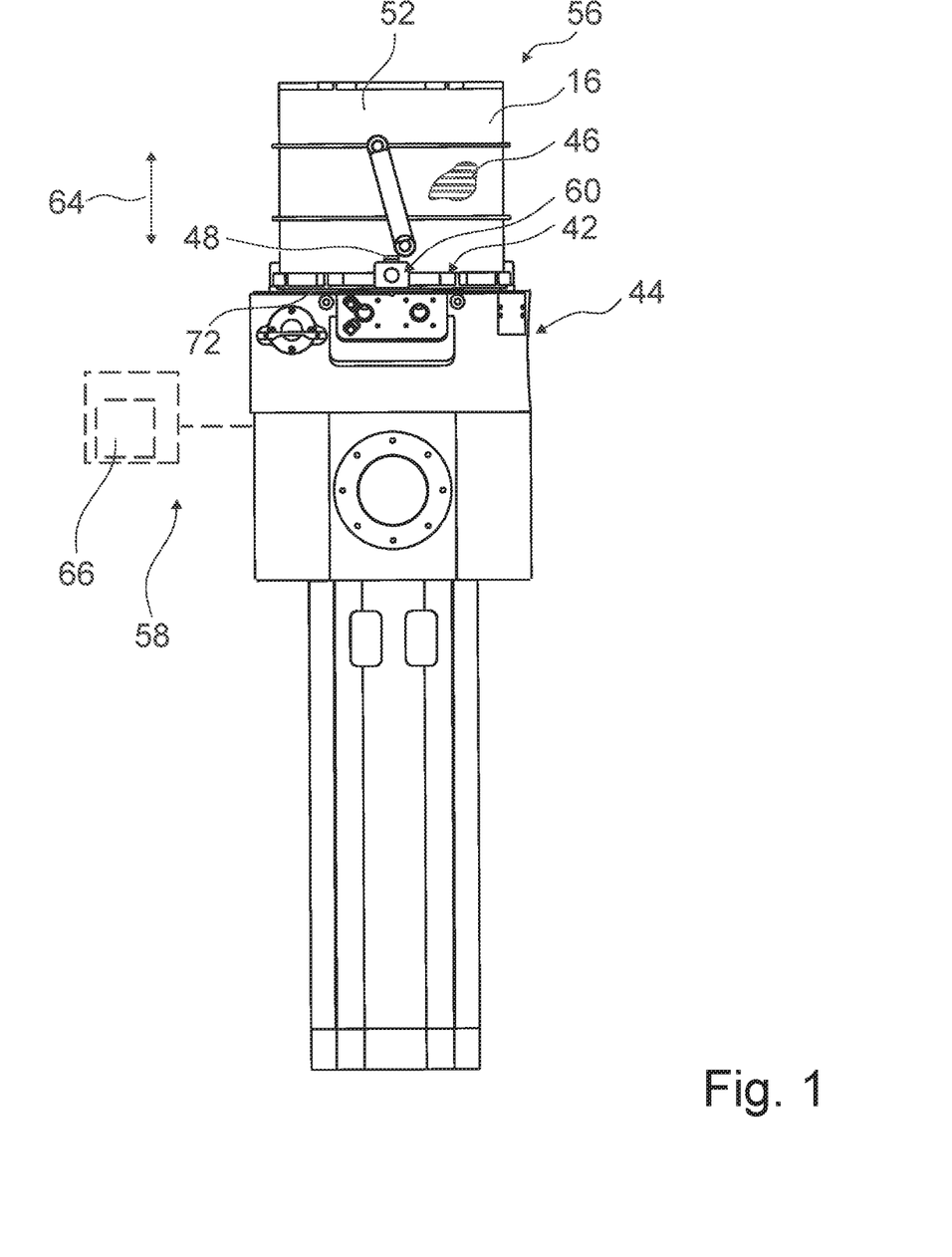
FIG. 1 a schematic view of a safeguarding system according to the invention, with a safeguarding device according to the invention, with a wafer transport container and with a loading and/or unloading station, FIG. 2 a schematic top view of the safeguarding system, FIG. 3 a sectional view of the safeguarding system, with the safeguarding device in a safeguard state, FIG. 4 a sectional view of the safeguarding system, with the safeguarding device in a non-safeguard state, FIG. 5 a sectional view of the safeguarding device in a non-safeguard state brought about by an emergency safeguarding element and/or emergency release element of the safeguarding device, and FIG. 6 a flow chart of a method according to the invention.

FIG. 1 shows a safeguarding system 56 with a safeguarding device. The safeguarding system 56 is implemented as a vacuum safeguarding system. The safeguarding device is implemented as a safeguarding device for a wafer transport container. The safeguarding device comprises three safeguarding modules 60 (cf. also FIG. 2). Alternatively the safeguarding device may comprise a number of safeguarding modules 60 that differs from three. The safeguarding system 56 comprises a wafer transport container 16. The wafer transport container 16 is configured for storage and/or transport of wafers 46. The wafer transport container 16 is configured for a transport of wafers 46 in a vacuum. The wafer transport container 16 is embodied in such a way that it is vacuum-tightly closable. The wafer transport container 16 is embodied as a vacuum wafer transport container.

The wafer transport container 16 comprises a base body 52. The base body 52 encompasses an interior of the wafer transport container 16 to a large extent. The base body 52 has an opening 62 (cf. FIG. 3). The wafers 46 stored in the wafer transport container 16 are retrievable out of the wafer transport container 16 and/or introducible into the wafer transport container 16 through the opening 62. The opening 62 has a diameter which is greater than a diameter of the wafers 46. The wafer transport container 16 comprises a wafer-transport-container opening element 14 (cf. FIG. 3). The wafer-transport-container opening element 14 is configured for closing the opening 62 of the wafer transport container 16. The wafer-transport-container opening element 14 is embodied in such a way that it is removable from the base body 52. The safeguarding device is configured to prevent in a safeguarding case a complete removal of the wafer-transport-container opening element 14 from the base body 52 of the wafer transport container 16.

The safeguarding system 56 comprises a loading and/or unloading station 44. The loading and/or unloading station 44 is configured for loading and/or unloading wafers 46 into and/or from the wafer transport container 16. For a loading and/or unloading of wafers 46, the loading and/or unloading station 44 opens the wafer transport container 16 by releasing the wafer-transport-container opening element 14 from the base body 52. To open the wafer transport container 16, the loading and/or unloading station 44 moves the wafer-transport-container opening element 14 in a loading and/or unloading direction 64. The loading and/or unloading direction 64 extends at least substantially perpendicularly to a main extension plane of the wafer-transport-container opening element 14. In opening, the wafer-transport-container opening element 14 is lowered into an interior of the loading and/or unloading station 44 by the loading and/or unloading station 44. In loading and/or unloading of the wafer transport container 16, an inner space of the base body 52 is vacuum-tightly connected to the inner space of the loading and/or unloading station 44. The loading and/or unloading station 44 is configured to transport wafers 46 unloaded from the wafer transport container 16 onward to at least one processing module (not shown) and/or at least one transfer module (not shown).

The safeguarding system 56 comprises a vacuum pump unit 58. The vacuum pump unit 58 is configured for a vacuum-clamping of the wafer transport container 16 on the loading and/or unloading station 44 in a loading and/or unloading position. The vacuum pump unit 58 comprises a vacuum pump 66. The vacuum pump unit 58 comprises a vacuum-clamping device 42. The vacuum pump 66 is configured to generate a negative pressure of the vacuum-clamping device 42. The vacuum-clamping device 42 is configured to fixedly hold, by way of the negative pressure, the wafer transport container 16 in the intended loading and/or unloading position relative to a surface 68 of the loading and/or unloading station 44.

Figure 2:
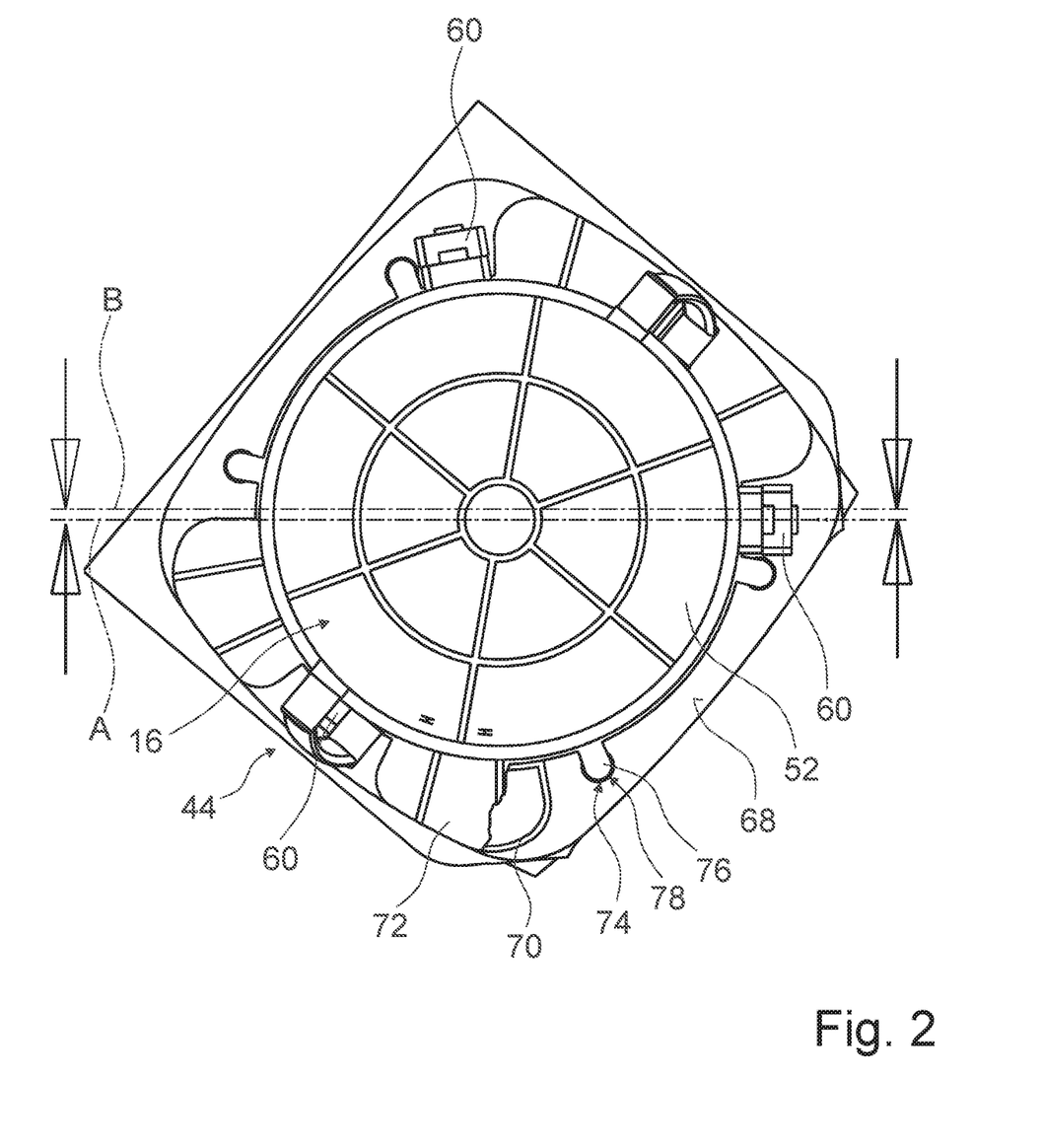

FIG. 2 shows a top view of the safeguarding system 56. The vacuum-clamping device 42 comprises vacuum-clamping elements 70. The vacuum-clamping device 42 comprises corresponding vacuum-clamping elements 72. The vacuum-clamping elements 70 are arranged on the loading and/or unloading station 44. The vacuum-clamping elements 70 are embodied as channel-like deepenings in the surface 68 of the loading and/or unloading station 44. The corresponding vacuum-clamping elements 72 are arranged on the wafer transport container 16. The corresponding vacuum-clamping elements 72 are embodied as ear-shaped flat bulges protruding horizontally from the base body 52. In the loading and/or unloading position the corresponding vacuum-clamping elements 72 cover the vacuum-clamping elements 70 completely. In vacuum-clamping, the vacuum pump unit 58 creates a negative pressure between the vacuum-clamping elements 70, 72, resulting in pressure forces caused by the ambient pressure pressing the corresponding vacuum-clamping elements 72 onto the vacuum-clamping elements 70. Due to the negative pressure between the vacuum-clamping elements 70, 72, the base body 52 is firmly pressed onto the surface 68 of the loading and/or unloading station 44.

The safeguarding system 66 comprises an alignment mechanism 74. The orientation mechanism 74 is configured to align the wafer transport container 16 with respect to the loading and/or unloading station 44. The alignment mechanism 74 comprises a plurality of projections 76, which are embodied in a bolt-like fashion. The projections 76 are arranged on the base body 52 of the wafer transport container 16. The alignment mechanism 74 comprises a plurality of hollows 78, each of them being configured to accommodate a respective projection 76. The hollows 78 are arranged in the surface 68 of the loading and/or unloading station 44.

Figure 3:
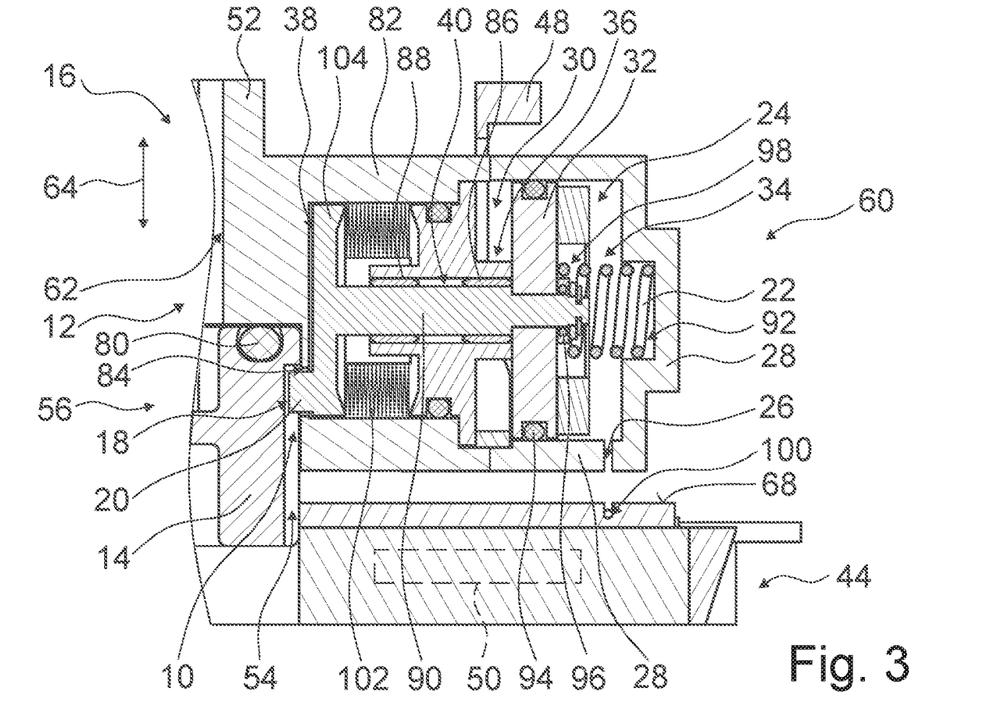

FIG. 3 shows a section through the safeguarding system 56 along a sectional plane which extends centrally through the safeguarding module 60 and is given the reference sign A in FIG. 2. In the situation shown in FIG. 3, the wafer transport container 16 and the loading and/or unloading station 44 are in a non-coupled state. In the situation shown in FIG. 3, the safeguarding device is in a safeguard state. The wafer transport container 16 comprises a closing mechanism 12. The closing mechanism 12 is configured to hold the wafer-transport-container opening element 14 in a closure position. The closing mechanism 12 is embodied as a vacuum closing mechanism. In the closure position the wafer-transport-container opening element 14 closes the opening 62 of the base body 52 of the wafer transport container 16. As a result of a vacuum in the inner space of the wafer transport container 16, the wafer-transport-container opening element 14 is pressed against the base body 52 of the wafer transport container 16 by external pressure forces. The closing mechanism 12 comprises a sealing element 80. The sealing element 80 of the closing mechanism 12 is configured to seal the closing mechanism 12 at least substantially in a gas-tight manner. The sealing element 80 of the closing mechanism 12 is embodied as an O-ring. Alternatively or additionally the sealing element 80 of the closing mechanism 12 could comprise a lip seal and/or a vulcanized seal.

The safeguarding device comprises a positive-fit unit 10. The positive-fit unit 10 is configured for a safeguarding of the wafer-transport-container opening element 14 of the wafer transport container 16, which is held in its closure position by the closing mechanism 12.

The positive-fit unit 10 comprises a positive-fit recess 18. The positive-fit recess 18 is configured to partially accommodate a positive-fit element 20 of the positive-fit unit 10. The positive-fit recess 18 is implemented as a groove in the wafer-transport-container opening element 14. Alternatively the positive-fit recess 18 could feature any other shape, preferably a shape adapted to a shape of the positive-fit element 20. In a coupled state of the wafer transport container 16 with the loading and/or unloading station 44, the positive-fit recess 18 is open towards the inner space of the loading and/or unloading station 44. The positive-fit unit 10 comprises the positive-fit element 20. The positive-fit element 20 is configured to partially engage in the positive-fit recess 18. The positive-fit element 20 is partly embodied as a rod-shaped locking bar. The positive-fit recess 18 and the positive-fit element 20 are configured to couple with one another in a contact-free manner in case of a proper safeguarding. The positive-fit recess 18 and the positive-fit element 20 are configured to couple with one another in a contacting manner in case of an unintended failure of the closing mechanism 12.

The safeguarding module 60 comprises a module base body 82. The module base body 82 forms a portion of an outer delimitation of the safeguarding module 60. The positive-fit element 20 is arranged partially within the module base body 82. The positive-fit element 20 is partly encompassed by the module base body 82. The module base body 82 comprises an opening 84. The positive-fit element 20 partly extends through the opening 84 of the module base body 82. The positive-fit element 20 is free of a contact with the opening 84 of the module base body 82. In this way, in case of a movement of the positive-fit element 20 a particle generation may be advantageously kept at a low level.

The safeguarding device is partially embodied integrally with the wafer transport container 16. The safeguarding device is embodied integrally with the base body 52 of the wafer transport container 16. The module base body 82 is embodied integrally with the base body 52 of the wafer transport container 16. The positive-fit element 20 is supported in such a way that it is movable relative to the module base body 82. The safeguarding device comprises a guide element 90. The guide element 90 is configured to guide a movement of the positive-fit element 20. The guide element 90 is embodied as a rounded guide rod. The guide element 90 and the positive-fit element 20 are embodied integrally with one another.

The safeguarding device comprises a linear bearing 40. The linear bearing 40 is configured to permit a translational movement of the positive-fit unit 10. The linear bearing 40 is configured to permit a translational movement of the positive-fit element 20. The linear bearing 40 comprises two bearing elements 86, 88. The bearing elements 86, 88 are implemented as slide bearings. The bearing elements 86, 88 form slide bushings. In a movement of the positive-fit element 20, the bearing elements 86, 88 remain stationary relative to the wafer transport container 16. The bearing elements 86, 88 are implemented of a plastic material or of a plastic-coated metal. Alternatively the linear bearing 40 could comprise a number of bearing elements 86, 88 that differs from two, e.g. one bearing element 86, 88 or three bearing elements 86, 88. Furthermore the linear bearing 40 could alternatively or additionally comprise at least one ball bearing. Moreover the positive-fit element 20, in particular the guide element 90, could also be embodied integrally with the linear bearing 40, for example in such a way that at least the guide element 90 comprises a slide surface, which is in particular realized by a coating.

The safeguarding device comprises a chamber 24. The chamber 24 forms a hollow space in an interior of the safeguarding module 60. The chamber 24 comprises a pressure connection channel 26. The pressure connection channel 26 is configured for coupling the chamber 24 with the vacuum-clamping device 42. The vacuum-clamping device 42 comprises a suction channel 100. The suction channel 100 is fluidically connected to the vacuum pump 66. In a coupling of the pressure connection channel 26 with the vacuum-clamping device 42, the suction channel 100 is gas-tightly connected to the pressure connection channel 26. The connection of the pressure connection channel 26 to the suction channel 100 is implemented free of coupling elements and flexible tubes, exclusively by tight abutment of the safeguarding module 60 on the surface 68 of the loading and/or unloading station 44.

With the exception of the pressure connection channel 26, the chamber 24 is implemented in such a way that it is sealed off from the environment in a gas-tight manner. The chamber 24 has an inner volume 34. The pressure connection channel 26 is configured to permit a variation of an inner pressure in the chamber 24 relative to a reference pressure. The pressure connection channel 26 forms a connection element for the vacuum pump unit 58. It is possible to evacuate the chamber 24 by means of the pressure connection channel 26. The pressure connection channel 26 is implemented as a bore in a chamber wall 28 of the chamber 24. The pressure connection channel 26 is arranged on an underside of the safeguarding module 60. The pressure connection channel 26 extends in a direction which is, in a state when the wafer transport container 16 is coupled with the base body 52 of the wafer transport container 16, at least substantially perpendicular to a main extension plane of the wafer-transport-container opening element 14. The pressure connection channel 26 is in a safeguard state and in a non-safeguard state open towards the chamber 24. The chamber walls 28 delimiting the chamber 24 are embodied separately from the module base body 82. The chamber walls 28 delimiting the chamber 24 are screwed with the module base body 82. This advantageously allows for simple assembly and/or maintenance of the safeguarding module 60. The chamber walls 28 delimiting the chamber 24 are embodied to be non-destructively demountable. Alternatively at least a portion of the chamber walls 28 delimiting the chamber 24 could be embodied integrally with the wafer transport container 16.

A difference between the inner pressure of the chamber 24 and the reference pressure constitutes a differential pressure. The differential pressure is implemented for influencing a safeguarding status of the positive-fit unit 10. A position of the positive-fit element 20 with respect to an immobile chamber wall 28 of the chamber 24 depends on the differential pressure. The positive-fit unit 10 is configured to take a non-safeguard position if the differential pressure exceeds a limit differential pressure. The positive-fit element 20 is not in engagement with the positive-fit recess 18 if the differential pressure is below a limit differential pressure. The positive-fit unit 10 is configured to take a safeguarding position if the differential pressure is below the limit differential pressure. The positive-fit element 20 is in engagement with the positive-fit recess 18 if the differential pressure exceeds the limit differential pressure. The limit differential pressure is realized as a limit value of the differential pressure.

The safeguarding device comprises a reset element 22. The reset element 22 is configured to re-deflect the positive-fit unit 10 into a safeguarding position. The reset element 22 is configured to hold the positive-fit unit 10 in the safeguarding position. The reset element 22 is embodied as a compression spring. A reset force of the reset element 22 acts in a direction that runs in parallel to a main extension direction of the positive-fit element 20. By a "main extension direction" of an object is herein in particular a direction to be understood which extends in parallel to a longest edge of a smallest geometric rectangular cuboid just still completely enclosing the object. The reset force of the reset element 22 acts at least indirectly onto the positive-fit element 20. The reset force of the reset element 22 presses the positive-fit element 20 into a safeguarding position. The reset element 22 is arranged within the chamber 24. The reset element 22 abuts on an inner face of a chamber wall 28 that faces away from the wafer transport container 16. The reset element 22 partly engages around the guide element 90. The chamber wall 28 facing away from the wafer transport container 16 comprises a protrusion 92. The protrusion 92 is implemented in a cylindrical shape. The protrusion 92 is configured to partly accommodate the reset element 22. The protrusion 92 is configured to advantageously prevent a slipping of the reset element 22, for example in case of a movement of the wafer transport container 16.

The safeguarding device comprises a further chamber 30. The further chamber 30 has an inner volume 36. In a safeguard state of the safeguarding device and in a non-safeguard state of the safeguarding device, the further chamber 30 has an inner pressure that is identical to an ambient pressure. The ambient pressure is implemented as an atmospheric pressure or as a cleanroom atmospheric pressure. Viewed from the wafer transport container 16, the further chamber 30 is arranged before the chamber 24. The guide element 90 is arranged within the further chamber 30. The linear bearing 40 is arranged within the further chamber 30. The safeguarding device comprises a movably supported setting element 32. The movably supported setting element 32 is embodied as a movable piston. The movably supported setting element 32 partially delimits the chamber 24. The movably supported setting element 32 partially delimits the further chamber 30. The chamber 24 and the further chamber 30 are gastightly sealed against each other by means of the movably supported setting element 32. The movably supported setting element 32 comprises a sealing element 94. The sealing element 94 of the movably supported setting element 32 is embodied as an O-ring. Alternatively or additionally the sealing element 94 of the movably supported setting element 32 could comprise a lip seal and/or a vulcanized seal.

The guide element 90 is guided through the movably supported setting element 32. The guide element 90 is fixedly connected to the movably supported setting element 32 via a fixation device 98. The fixation device 98 comprises a Benzing® retaining ring. Alternatively or additionally the fixation device 98 may comprise a Seeger® retaining ring, a safety wiring and/or a screwing. The movably supported setting element 32 comprises a further sealing element 96. The further sealing element 96 of the movably supported setting element 32 is configured for sealing off the pass-through for the guide element 90 against the chamber 24 in a gastight manner. The further sealing element 96 of the movably supported setting element 32 is embodied as an O-ring. Alternatively or additionally the further sealing element 96 of the movably supported setting element 32 could comprise a lip seal and/or a vulcanized seal. The non-movably supported setting element 32 is configured for varying the inner volume 34 of the chamber 24 depending on a pressure difference of the inner pressures of the chamber 24 and the further chamber 30. The movably supported setting element 32 is configured for varying the inner volume 36 of the further chamber 30 depending on the pressure difference of the inner pressures of the chamber 24 and the further chamber 30.

The safeguarding device comprises a status sensor 50. The status sensor 50 is configured to sense a safeguarding status of the safeguarding device. The status sensor 50 is allocated to the loading and/or unloading station 44. The status sensor 50 is configured to communicate a safeguarding status of the safeguarding device to the loading and/or unloading station 44. In this way it is advantageously possible to prevent initiation of an opening process for opening the wafer-transport-container opening element 14 by the loading and/or unloading station 44 while a safeguarding of the safeguarding device, in particular of the positive-fit unit 10, is still active, such that damages to the wafer transport container 16 may advantageously be avoided. The status sensor 50 comprises a magnet sensor, which is capable of capturing a movement and/or a position of a component of the safeguarding module 60, in particular of the guide element 90 and/or of the positive-fit element 20.

The safeguarding device comprises an additional further chamber 38. The additional further chamber 38 is configured to have in at least one operating state an inner pressure differing from the ambient pressure. Viewed from the wafer transport container 16, the additional further chamber 38 is arranged before the further chamber 30. Viewed from the wafer transport container 16, the additional further chamber 38 is arranged before the chamber 24. The additional further chamber 38 is gas-tightly sealed against the further chamber 30. The safeguarding device comprises an additional sealing element 102. The additional sealing element 102 of the safeguarding device is configured to gas-tightly insulate the further chamber 30 and the additional further chamber 38 from each other in a gastight manner. The additional sealing element 102 of the safeguarding device is embodied to be compressible. The additional sealing element 102 of the safeguarding device is configured for being compressed and/or expanded upon a movement of the positive-fit element 20 and/or of the guide element 90. The safeguarding device comprises a transfer element 104. The transfer element 104 is configured to transfer a movement of the guide element 90 and/or of the positive-fit element 20 onto the additional sealing element 102 of the safeguarding device. The transfer element 104 is embodied integrally with the guide element 90. The transfer element 104 is embodied integrally with the positive-fit element 20. The additional sealing element 102 of the safeguarding device is embodied as a edge-welded bellows element. The edge-welded bellows element is made of metal. The positive-fit element 20 is partially arranged in the additional further chamber 38. The additional further chamber 38 is embodied in such a way that it is open to an outside by the opening 84 of the module base body 82. In a non-coupled state of the wafer transport container 16, the inner pressure in the additional further chamber 38 is identical to the ambient pressure.

Figure 4:
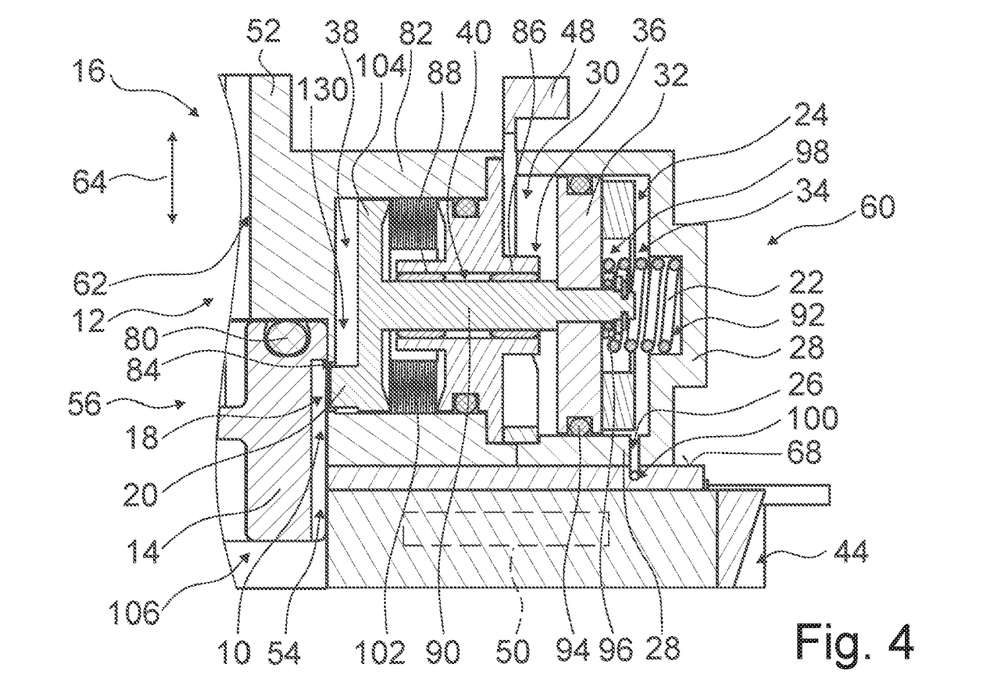

FIG. 4 shows, like FIG. 3, a section through the safeguarding system 56 along the sectional plane which extends centrally through the safeguarding module 60 and is given the reference sign A in FIG. 2. In the situation shown in FIG. 4, the wafer transport container 16 and the loading and/or unloading station 44 are in a coupled state. In the situation shown in FIG. 4, the safeguarding device is in a non-safeguard state. In the non-safeguard state the chamber 24 is evacuated via the pressure connection channel 26, as a result of which the movably supported setting element 32 is pushed in a direction away from the wafer transport container 16. Due to this, the inner volume 34 of the chamber 24 is reduced and an inner volume 130 of the additional further chamber 38 is increased. Moreover, the positive-fit element 20 is for this reason arranged in such a way that it is to a large extent retracted into the additional further chamber 38. The additional sealing element 102 of the safeguarding device is compressed.

The positive-fit recess 18 implemented in the wafer transport container 16 forms a further pressure connection channel 54. The further pressure connection channel 54 is configured for evacuating the additional further chamber 38 of the safeguarding device. The possibility of an evacuation of the additional further chamber 38 by the further pressure connection channel 54 is restricted to the state when the wafer transport container 16 is coupled with the loading and/or unloading station 44. In the coupled state of the wafer transport container 16 with the loading and/or unloading station 44, the pressure connection channel 54 implements a connection of the additional further chamber 38 to a gas-tightly insulated interstice 106 between an underside of the wafer-transport-container opening element 14 and an upper side of the loading and/or unloading station 44. An inner pressure in the interstice 106 is coupled with the inner pressure in the chamber 24. The inner pressure in the chamber 24 and the inner pressure in the interstice 106, and thus the inner pressure in the additional further chamber 38 as well, are generated by the vacuum pump 66 of the vacuum pump unit 58. The vacuum pump unit 58 is configured for varying the inner pressure in the chamber 24.

The safeguarding device comprises an emergency safeguarding and/or emergency release element 48. The emergency safeguarding and/or emergency release element 48 is configured for a manual emergency safeguarding and/or for a manual emergency release of the safeguarding device. The emergency safeguarding and/or emergency release element 48 is arranged at least partially in the further chamber 30. The emergency safeguarding and/or emergency release element 48 is movably supported in the further chamber 30. For an emergency release, an operator pulls the emergency safeguarding and/or emergency release element 48 out of the further chamber 30. The emergency safeguarding and/or emergency release element 48 is embodied as a pull-out lever protruding from the safeguarding module 60.

Figure 5:
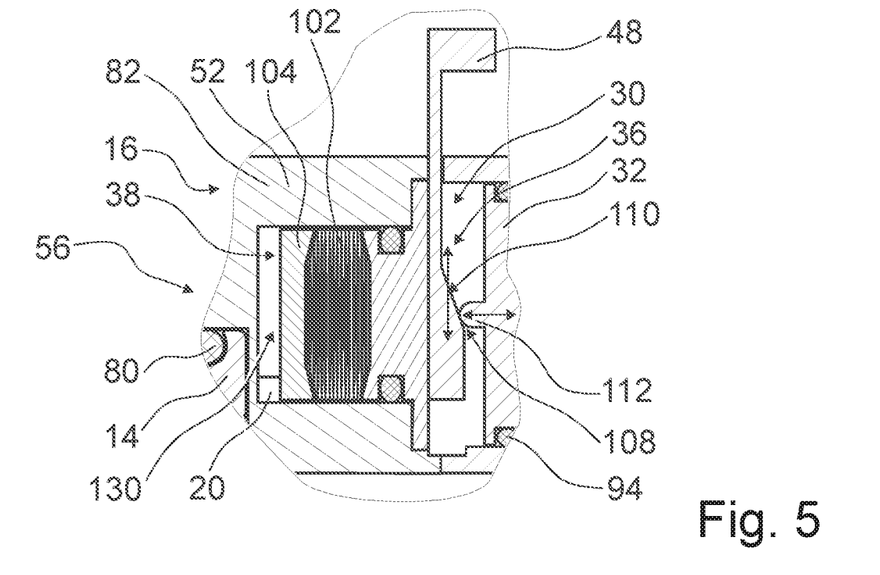

FIG. 5 shows another section through the safeguarding system 56 along another sectional plane, which extends through the safeguarding module 60 and is indicated with the reference sign B in FIG. 2. In the situation illustrated in FIG. 5, the safety element of the safeguarding device has been released via the emergency safeguarding and/or emergency release element 48. The emergency safeguarding and/or emergency release element 48 is configured to displace, in an emergency release, the movably supported setting element 32 towards the chamber 24. The emergency safeguarding and/or emergency release element 48 is configured to push, in an emergency release, the positive-fit element 20 towards the chamber 24. The emergency safeguarding and/or emergency release element 48 is configured to undo, in an emergency release, the engagement of the positive-fit element 20 with the positive-fit recess 18. The emergency safeguarding and/or emergency release element 48 comprises a cam mechanism 108. The cam mechanism 108 is configured to convert a movement of the emergency safeguarding and/or emergency release element 48 into a movement of the movably supported setting element 32 and/or of the positive-fit element 20 perpendicularly to the movement of the emergency safeguarding and/or emergency release element 48. The cam mechanism 108 comprises a slope 110 and a pin 112. The slope 110 is arranged on the emergency safeguarding and/or emergency release element 48. The slope 110 connects a point of the emergency safeguarding and/or emergency release element 48 that has a small material thickness to a point of the emergency safeguarding and/or emergency release element 48 that has a greater material thickness. The pin 112 is arranged on the movably supported setting element 32. In a safeguard state of the safeguarding device, the pin 112 abuts on the point of the emergency safeguarding and/or emergency release element 48 that has a low material thickness. When the emergency safeguarding and/or emergency release element 48 is pulled out in a vertical direction, the slope 110 moves along the pin 112, which is immobile in the vertical direction. The material thickness of the emergency safeguarding and/or emergency release element 48 increases along the slope 110, and the pin 112 is therefore necessarily deflected horizontally. In a state of emergency release of the safeguarding device, the pin 112 abuts on the point of the emergency safeguarding and/or emergency release element 48 that has a greater material thickness. When the emergency safeguarding and/or emergency release element 48 is then moved back into the further chamber 30, the reset element 22 deflects the movably supported setting element 32 and/or the positive-fit element 20 back into the original position of the safeguard state.

Figure 6:
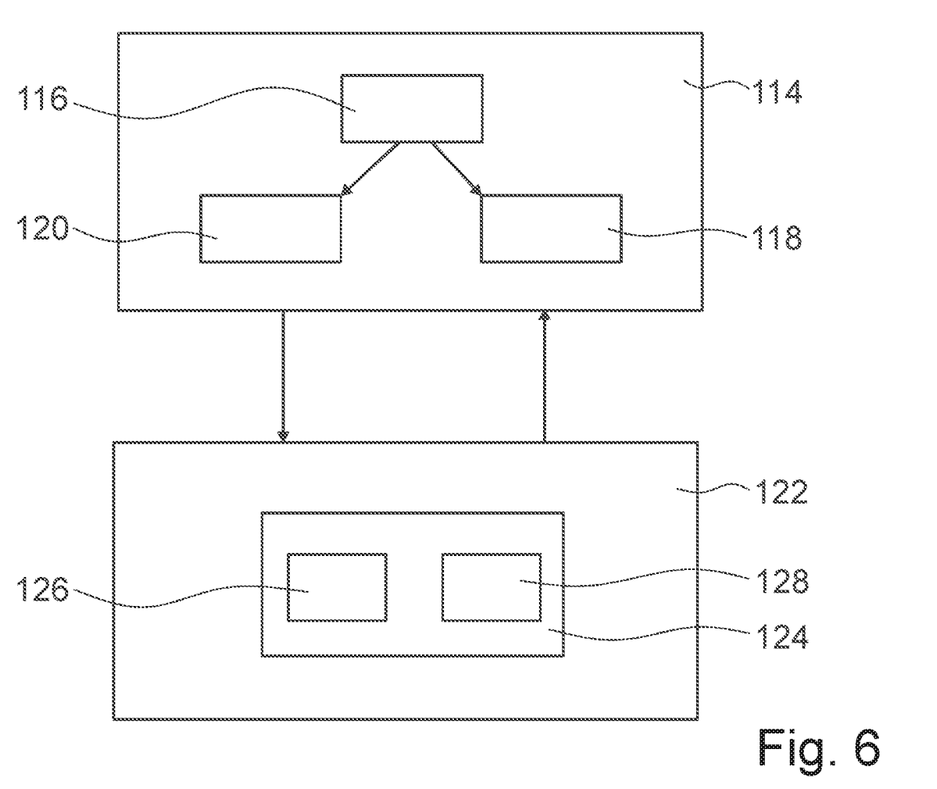

FIG. 6 shows a flow chart of a method with the safeguarding device. In at least one method step 114 the wafer transport container 16 is transported and/or stored. During said transport and/or during said storage, in at least one method step 116 the wafer-transport-container opening element 14, which is held in its closure position by means of the closing mechanism 12, is safeguarded by the positive-fit unit 10. In a fault-free normal operation of the closing mechanism 12, in at least one method step 120 the wafer-transport-container opening element 14 is safeguarded by the positive-fit unit 10 in a touch-free manner. In case of a malfunction of the closing mechanism 12, in at least one method step 118 a touch contact of the positive-fit unit 10 with the wafer-transport-container opening element 14 is established. Herein the touch contact of the positive-fit unit 10 with the wafer-transport-container opening element 14 is established to ensure a holding of the wafer-transport-container opening element 14 in a proximity of the closure position. In at least one method step 122, the wafer transport container 16 is coupled with the loading and/or unloading station 44. In at least one method step 124 a safeguarding and/or release of the positive-fit unit 10 is generated via a variation of an inner pressure in the chamber 24 of the safeguarding device. For the purpose of safeguarding the wafer-transport-container opening element 14, in at least one method step 128 the positive-fit element 20 is moved into a safeguard position by reduction of the differential pressure between the chamber 24 and the further chamber 30. For the purpose of a release of the safeguarding of the wafer-transport-container opening element 14, in at least one method step 126 the positive-fit element 20 is moved into a non-safeguard position by an increase of the differential pressure between the chamber 24 and the further chamber 30.

The invention claimed is:

1. A safeguarding device with at least one positive-fit unit configured at least for a safeguarding of a wafer-transport-container opening element of a wafer transport container, wherein the wafer transport container is held in its closure position by a closing mechanism, wherein in the closure position the wafer-transport-container opening element closes the opening of a base body of the wafer transport container, wherein the closing mechanism comprises at least one chamber, wherein the at least one chamber comprises a pressure connection channel that is configured to allow a variation of an inner pressure in the at least one chamber relative to a reference pressure, wherein a differential pressure is based on the inner pressure of the at least one chamber and the reference pressure and is configured to influence a safeguarding status of the at least one positive-fit unit, wherein the safeguarding device comprises at least one further chamber having, in a safeguard state of the safeguarding device and in a non-safeguard state of the safeguarding device, an inner pressure that has the same value as an ambient pressure.

2. The safeguarding device according to claim 1, wherein the at least one positive-fit unit comprises at least one positive-fit recess and at least one positive-fit element, wherein the at least one positive-fit recess and the at least one positive-fit element are configured to couple with one another in a contact-free fashion in a proper safeguarding.

3. The safeguarding device according to claim 1, further comprising an at least partial integral implementation with the wafer transport container.

4. The safeguarding device according to claim 1, further comprising at least one reset element, which is configured to at least one of re-deflect the at least one positive-fit unit at least partly into a safeguarding position and hold the at least one positive-fit unit in the safeguarding position.

5. The safeguarding device according to claim 1, further comprising at least one reset element, which is configured to re-deflect the at least one positive-fit unit at least partly into at least one of a safeguarding position and hold the at least one positive-fit unit in the safeguarding position, wherein the at least one reset element is arranged, at least partly, inside the at least one chamber.

6. The safeguarding device according to claim 1, wherein the at least one positive-fit unit comprises at least one movably supported positive-fit element, wherein a position of the at least one positive-fit element relative to at least one chamber wall of the at least one chamber depends on the differential pressure.

7. The safeguarding device according to claim 1, wherein the at least one positive-fit unit is configured to take a non-safeguard position if the differential pressure exceeds a limit differential pressure.

8. The safeguarding device at least according to claim 1, further comprising at least one movably supported setting element, which delimits the at least one chamber and the at least one further chamber at least partly.

9. The safeguarding device according to claim 8, wherein the at least one setting element is configured to vary, depending on a pressure difference of the inner pressures of the at least one chamber and the at least one further chamber, an inner volume of the at least one chamber, and an inner volume of the further chamber.

10. The safeguarding device according to claim 1, further comprising at least one additional further chamber, which is configured to have, in at least one operating state, an inner pressure that differs from an ambient pressure.

11. The safeguarding device according to claim 1, further comprising a linear bearing that is configured to permit a translational movement of the at least one positive-fit unit.

12. The safeguarding device according to claim 1, wherein the pressure connection channel is configured to couple at least the at least one chamber with a vacuum-clamping device of a loading and unloading station that is configured at least for loading and unloading at least one wafer into or from the wafer transport container.

13. The safeguarding device according to claim 1, further comprising at least one emergency safeguarding and emergency release element, which is configured for at least one of manual emergency safeguarding and manual emergency release of the safeguarding device.

14. The safeguarding device according to claim 13, wherein the at least one emergency safeguarding and emergency release element is arranged at least partly in at the least one further chamber.

15. The safeguarding device according to claim 1, further comprising at least one status sensor, which is configured to sense a safeguarding status of the safeguarding device.

16. A wafer transport container with at least one safeguarding device according to claim 1, which is configured to prevent, in a safeguarding case, a complete removal of the wafer-transport-container opening element from the base body of the wafer transport container.

17. The wafer transport container according to claim 16, wherein the at least one safeguarding device is embodied integrally with the base body of the wafer transport container.

18. The wafer transport container according to claim 16, wherein the wafer transport container comprises at least one positive-fit recess, the at least one positive-fit recess implementing a further pressure connection channel, which is configured for an evacuation of an additional further chamber of the safeguarding device.

19. A safeguarding system with at least one safeguarding device according to claim 1, with a wafer transport container, and with a loading and unloading station which is configured at least for loading and unloading wafers into or from the wafer transport container.

20. The safeguarding system according to claim 19, further comprising a vacuum pump unit, which is configured at least for a vacuum-clamping of the wafer transport container on the loading and unloading station in a loading and unloading position, and for varying the inner pressure in the at least one chamber.

21. A method with the safeguarding device according to claim 1, wherein the wafer-transport-container opening element of the wafer transport container, which is held in its closure position by the closing mechanism, is safeguarded by means of the at least one positive-fit unit.

22. The method according to claim 21, wherein the safeguarding of the at least one positive-fit unit is realized by the variation of the inner pressure in the at least one chamber of the safeguarding device.

23. The method according to claim 21, wherein, in a fault-free normal operation of the closing mechanism, the wafer-transport-container opening element is safeguarded by the at least one positive-fit unit in a contact-free fashion, wherein, in case of a malfunction of the closing mechanism, a touch contact is established of a positive-fit element of the at least one positive-fit unit, with the wafer-transport-container opening element for the purpose of establishing a holding of the wafer-transport-container opening element in a proximity of the closure position.

* * * * *